United States Patent
Bains et al.

(10) Patent No.: US 9,710,323 B2
(45) Date of Patent: Jul. 18, 2017

(54) DELAY-COMPENSATED ERROR INDICATION SIGNAL

(75) Inventors: Kuljit Singh Bains, Olympia, WA (US); George Vergis, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/997,850

(22) PCT Filed: Mar. 31, 2012

(86) PCT No.: PCT/US2012/031759
§ 371 (c)(1),
(2), (4) Date: Jun. 25, 2013

(87) PCT Pub. No.: WO2013/147913
PCT Pub. Date: Oct. 3, 2013

(65) Prior Publication Data
US 2014/0013168 A1    Jan. 9, 2014

(51) Int. Cl.
| G06F 11/00 | (2006.01) |
| G06F 11/10 | (2006.01) |
| G11C 29/42 | (2006.01) |
| G11C 5/04 | (2006.01) |
| G11C 7/10 | (2006.01) |
| G11C 29/44 | (2006.01) |
| G11C 29/04 | (2006.01) |

(52) U.S. Cl.
CPC ............ *G06F 11/10* (2013.01); *G06F 11/108* (2013.01); *G11C 5/04* (2013.01); *G11C 7/1063* (2013.01); *G11C 29/42* (2013.01); *G11C 29/44* (2013.01); *G11C 2029/0409* (2013.01); *G11C 2029/0411* (2013.01)

(58) Field of Classification Search
CPC ...................................................... G06F 11/10
See application file for complete search history.

(56) References Cited

U.S. PATENT DOCUMENTS

| 4,445,171 A * | 4/1984 | Neches .......................... 710/104 |
| 5,588,112 A * | 12/1996 | Dearth et al. ................. 714/5.11 |
| 8,862,973 B2 | 10/2014 | Bains et al. |

(Continued)

FOREIGN PATENT DOCUMENTS

| WO | WO 9205486 A1 * | 4/1992 | .............. G06F 11/10 |
| WO | 2013/147913 A1 | 10/2013 | |

OTHER PUBLICATIONS

International Preliminary Report on Patentability and Written Opinion received for PCT Patent Application No. PCT/US2012/031759, mailed on Oct. 9, 2014, 6 pages.

(Continued)

*Primary Examiner* — Yolanda L Wilson
(74) *Attorney, Agent, or Firm* — Compass IP Law PC

(57) ABSTRACT

A memory subsystem has multiple memory devices coupled to a command/address line and an error alert line, the error alert line delay-compensated to provide deterministic alert signal timing. The command/address line and the error alert line are connected between the memory devices and a memory controller that manages the memory devices. The command/address line is driven by the memory controller, and the error alert line is driven by the memory devices.

27 Claims, 5 Drawing Sheets

(56) References Cited

U.S. PATENT DOCUMENTS

| | | |
|---|---|---|
| 2003/0163767 A1 | 8/2003 | Phelps |
| 2006/0069948 A1 | 3/2006 | Seo et al. |
| 2008/0005647 A1* | 1/2008 | Bains ........................... 714/781 |
| 2009/0150721 A1* | 6/2009 | Kochar et al. .................... 714/6 |
| 2011/0138261 A1 | 6/2011 | Bains et al. |
| 2011/0320867 A1* | 12/2011 | Chaudhuri et al. ............. 714/15 |

OTHER PUBLICATIONS

International Search Report received for PCT Patent Application No. PCT/US2012/031759, mailed on Nov. 14, 2012, 5 pages.

* cited by examiner

DELAY-COMPENSATED ERROR INDICATION SIGNAL

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright © 2012, Intel Corporation, All Rights Reserved.

FIELD

Embodiments of the invention are generally related to memory devices, and more particularly to delay-compensating an error indication signal in a memory subsystem.

BACKGROUND

There are memory subsystems that enable parity error checking at the memory devices. For signals sent by the memory controller over the signal lines to the memory devices, the memory devices can check for parity error and trigger an error if the parity check fails. The memory controller is a single sender, and the memory devices are many receivers for the same signal. The receivers are placed sequentially on the signal line, which means that each of the memory devices receives the signals from the memory controller at a different point in time. Additionally, the memory devices share a signal line for an error alert signal. Thus, when the memory devices trigger an error there is a slightly different timing from the memory devices to the memory controller. In traditional systems, the memory devices trigger an error alert signal as soon as they detect the error, and route a signal back to the memory controller along the error alert line. Seeing that symbol corruption can occur at any point along the signal line from the controller to the last memory device, there is no way of knowing when an alert signal could reach the memory controller.

In traditional systems where the memory controllers keeps a history of commands for purposes of error recovery, the depth of the history needed to be deep enough to cover the worst-case error alert signal. The worst-case signal timing assumed the last memory device to receive the command/address signal would send an alert, which would then be routed all the way back to the memory controller.

When the speed of the processor is slow relative to the speed of signal transmission, the difference in timing has little effect on the system. However, as systems speed up, the worst-case scenario could be dozens of pipeline stages (instructions) of execution occurring while the memory controller waits for an error alert. The memory controller would need to save a history to match the number of pipeline stages to be able to perform error recovery. If the error signal from the memory devices does not reach the controller before data associated with a command arrives at the memory controller, the memory controller could latch in the wrong data. The timing of current systems is very marginal, which makes the error alert and recovery mechanisms suspect, and requires a lot of resources to perform error recovery.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as discussing other potential embodiments or implementations of the inventive concepts presented herein. An overview of embodiments of the invention is provided below, followed by a more detailed description with reference to the drawings.

DETAILED DESCRIPTION

As described herein, a memory subsystem has a memory module with multiple memory devices coupled to a command/address (C/A) line and an error alert line. The memory devices are multiple receivers for the C/A line. The memory controller drives the C/A line to provide commands and address information to identify memory access to the memory devices. The error alert line is driven by any of the memory devices to alert the memory controller of an error condition in a C/A signal. The error alert line is delay-compensated to provide deterministic alert signal timing. With delay-compensation, the timing of the alert signal is expected, which reduces the worst-case latency.

One memory subsystem that supports a configuration with memory devices of a memory module sharing a C/A line and an error alert line is DDR4 (dual data rate, version 4). It will be understood that the C/A line and the error alert line could both be referred to as transmission lines. For purposes of shorthand herein, reference to a C/A line refers to the transmission line or the wire (or trace) that carries the C/A signal, and reference to an error alert line refers to the transmission line or the wire (or trace) that carries an error alert signal. To the extent other memory subsystems are configured with memory devices sharing a C/A line and an error alert line driven by the memory devices, it is contemplated that such subsystems can be configured in accordance with the delay compensation described herein.

Figure 1:
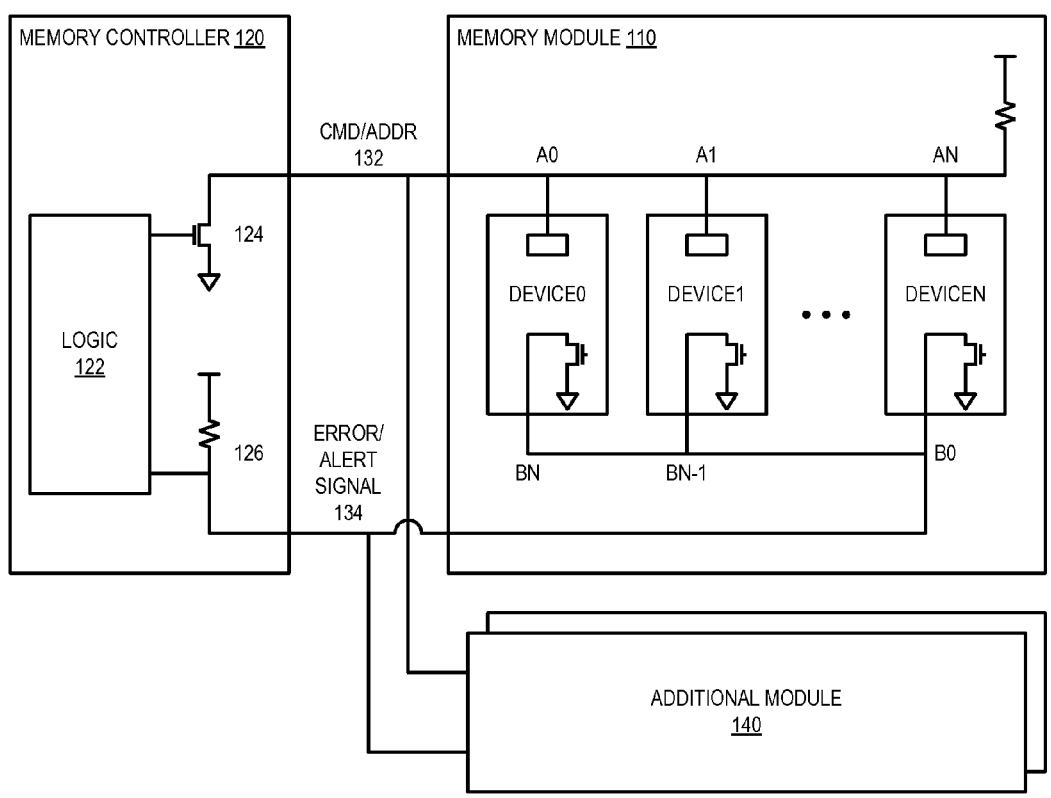
FIG. 1 is a block diagram of an embodiment of a system that implements delay-compensated error signaling.

FIG. 1 is a block diagram of an embodiment of a system that implements delay-compensated error signaling. System 100 includes a memory subsystem with memory module 110 and memory controller 120. In one embodiment, the memory subsystem includes one or more additional memory modules 140. In one embodiment, C/A (command/address) signal 132 is bussed across all memory devices (Device0, Device1, . . . , DeviceN) of memory module 110. In one embodiment, the memory devices are DRAM (dynamic random access memory) devices, and could be any type of DRAM (e.g., SDRAM, synchronous DRAM). In one embodiment, memory module 110 is a dual inline memory module (DIMM), such as a UDIMM (unregistered DIMM) or SODIMM (small outline DIMM).

For purposes of illustration only, active elements (e.g., transistors or switches) represent the elements that drive a signal line. It will be understood by those skilled in the art that more complex drivers can be used than a simple switch as shown. Such elements are known in the art and will not be discussed in detail herein. Memory controller 120 includes logic 122, which can include command logic to processing issue commands over C/A signal line 132, driven by element 124. Error or alert signal line 134 is driven by Device0 DeviceN, to pull down the node at resistor element 126. In one embodiment, elements 124 and 126 can be considered part of logic 122. Error/alert signal line 134 is for Device0 DeviceN to indicate an error or other alert to memory controller 120.

In one embodiment, Device0 DeviceN detect errors in signals sent by memory controller 120 over C/A line 132. In one embodiment, the error detection is parity error checking. In one embodiment, the error detection is cyclic redundancy checking (CRC). Other types of error checking could be performed in addition to, or alternatively to these types of error checking.

Memory module 110 is enabled or disabled to perform error checking. In one embodiment, memory module 110 is a module having DDR4 DRAM memory devices, which can be selectively enabled to perform C/A parity checking. The example that follows will be understood by those skilled in the art to be one non-limiting example that can be extended to other types of memory, and/or to other types of error checking.

In the example of parity checking for DDR4 DRAM, memory module 110 can be enabled or disabled based on bits in, for example, a mode register or other configuration information storage. With C/A parity checking enabled, the memory devices can ensure there is no parity error before executing the command, such as accessing or refreshing the data. The additional delay for performing parity checking prior to executing the commands can be programmed into the system (e.g., a parity latency) and applied to all commands. The parity could be even or odd, depending on the implementation, as is understood by those skilled in the art.

In one embodiment, if any of Device0 . . . DeviceN detects a C/A parity error in any command, ignores the erroneous command, and logs the error by storing the erroneous command and address bits in an error log. The memory device drives error signal line 134 and sets a Parity Error Status indicator (e.g., a bit) to 'error'. It is possible that a refresh command can be ignored during a window of time that an error is asserted. Thus, memory controller 120 can issue additional refresh cycles as needed after coming out of the error condition.

In system 100, C/A line 132 is illustrated as connecting in sequence from Device0 at node A0 (the closest physical routing connection to memory controller 120) through DeviceN at node AN (the farthest physical routing connection from memory controller 120). Memory controller 120 drives C/A line 132, which means that Device0 will receive the C/A signal before Device1, which will receive it before DeviceN. Thus, each of the devices receives the C/A signal at a different point in time. If each device is configured to immediately trigger an error signal or alert signal on error/alert signal line 134, Device0 would trigger the error signal prior to Device1, and so forth in the same order as the signal is received.

In traditional systems, error/alert signal line 134 is routed the same direction as C/A line 132, which means that if Device0 detects an error, the error signal will reach memory controller 120 sooner than if DeviceN detects an error and drives error/alert signal line 134. As described herein, error/alert signal line 134 is delay-compensated. One way to delay-compensate error/alert signal line 134 is to route it the opposite direction from C/A line 132. Thus, as illustrated, the closest connection to memory controller 120 is node B0 at DeviceN. The connections go out to DeviceN−1 at node B1 (not shown) to Device1 at node BN−1, and finally to Device0 at node BN.

It will be understood that delay compensation could also be achieved with logic, such as by introducing a delay in the triggering of the memory devices so they will trigger at approximately the same time. However, such an approach requires logic and is not scalable (i.e., every system would have to be separately configured based on processor and transmission line timing). With the routing of error/alert signal line 134, an automatically scaled delay will simply be built into the system without the need for logic, latches or gates, or configuration. In one embodiment, the C/A signal line is routed in order from the device with the lowest address to the device of highest address, while the error signal line is routed in reverse from highest address to lowest. The signal lines could alternatively be routed the other direction.

More details with respect to the timing and effects of delay compensation are set out below with respect to FIGS. 2A, 2B, and 3. Briefly, it will be understood that the timing of the error signal becomes more deterministic. Thus, for devices that share C/A line 132 and error/alert signal line 134, the delay compensation provides a deterministic alert signal timing for memory controller 120.

Figure 2A:
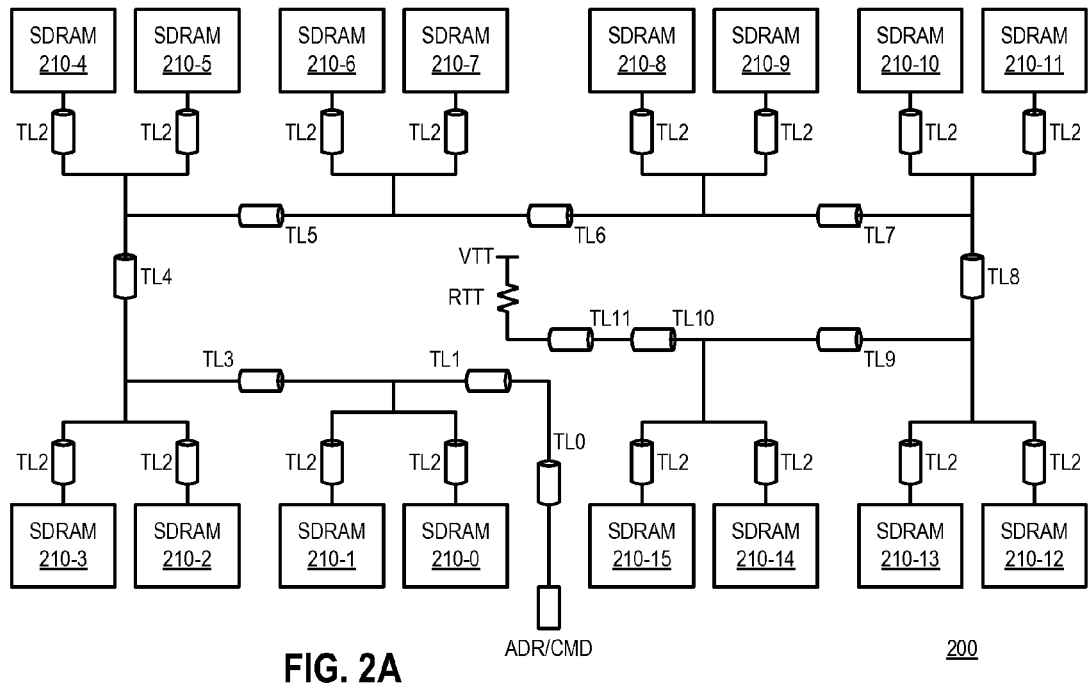
FIG. 2A is a block diagram of an embodiment of address/command signal routing in a DIMM.

FIG. 2A is a block diagram of an embodiment of address/command signal routing in a DIMM. System 200 illustrates a memory module (e.g., a DIMM) with 16 devices (SDRAM 210-0 . . . SDRAM 210-15). The configuration shown is a dual-rank x8 memory module. System 200 could be one example of module 110 of system 100. The C/A line is illustrated separated into individual transmission line (TL) segments 0-11. In one embodiment, a memory controller drives the C/A line from a pin that connects out to all devices SDRAM 210-0 . . . 210-15.

As is known in the art, the SDRAMs can be grouped in pairs to connect to a segment of the transmission line. Each device is assumed to connect in a similar way to the main transmission line, and thus, a transmission line is shown from each SDRAM to the C/A line at various connection points, but the individual transmission lines at the SDRAM devices are not labeled. Each of the segments TL0-TL10 can have different properties. An error can occur along any point of the transmission line. Thus, an error can develop and be detected at SDRAM 210-11 that was not present at SDRAM 210-10, or any of the other previous devices. As shown, the devices connect in sequence to the C/A line.

Figure 2B:
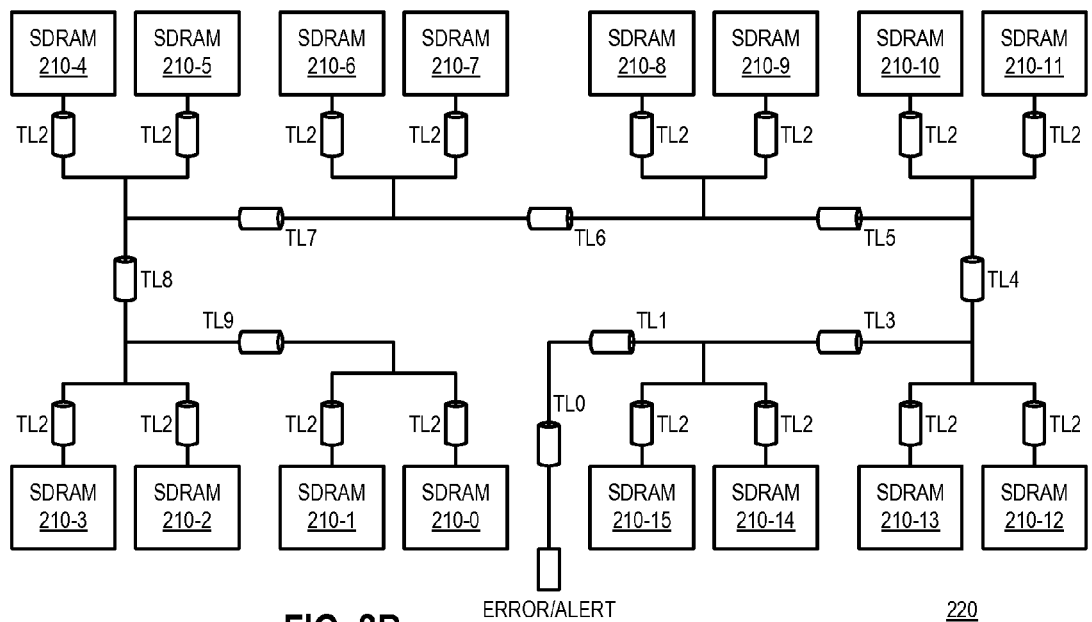
FIG. 2B is a block diagram of an embodiment of error signal routing in a DIMM.

FIG. 2B is a block diagram of an embodiment of error signal routing in a DIMM. In FIG. 2B, system 200 is illustrated with one embodiment of error signal routing for device SDRAM 210-0 . . . 210-15. Whereas the C/A line is routed from TL0 to TL10, in sequence from SDRAM 210-0 through 210-15, the error line is routed from TL20 to TL28, in sequence from SDRAM 210-15 down to 210-0. Thus, the error line is illustrated as being routed in the opposite direction as the C/A line.

The SDRAM devices provide feedback over an alert pin coupled to the error line at the memory device, such as in the event of detecting parity or CRC errors or other alert condition. In one implementation, a memory device that detects a parity error drives the error line (e.g., ALERT_n) low (or a logic "ON", whether driven high or low) for a pulse width in the range of 48 nCK to 144 nCK depending on the frequency of operation. In one embodiment, a memory device that detects a CRC error will send a 2 nCK pulse to the memory controller (host).

Figure 3:
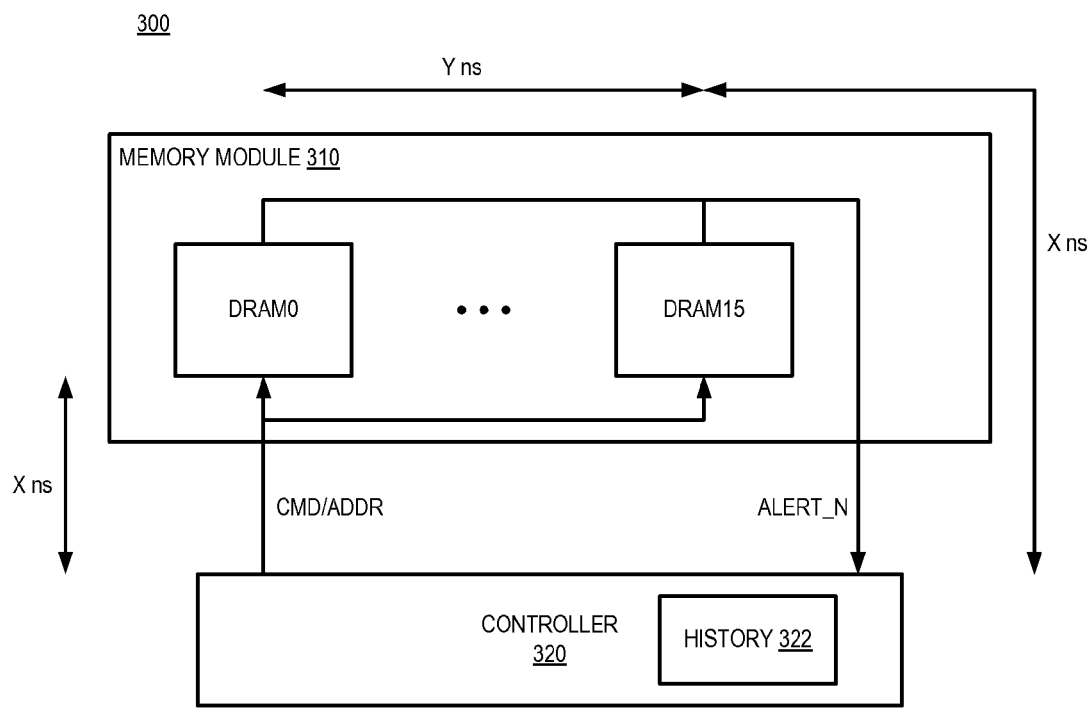
FIG. 3 is a block diagram of an embodiment of signal routing timing in a memory subsystem.

FIG. 3 is a block diagram of an embodiment of signal routing timing in a memory subsystem. System 300 provides one example of a memory subsystem in accordance with any embodiment described herein. In one embodiment, memory module 310 includes 16 devices, although a different number of devices could be used. The devices are DRAM0 . . . DRAM 15. Memory controller 320 is connected to the memory devices via the C/A line, and the error alert line (ALERT_n).

In one embodiment, controller 320 includes history 322. History 322 is a storage or buffer of commands issued by the controller to the DRAMs. The depth of history 322 needs to be sufficient to store enough commands to have a command determined to be associated with an error signal received at controller 320 over ALERT_n from memory module 310. Thus, the error alert signal is received to determine what command caused an error, and the controller attempts a recovery of system 300. Without a sufficient history, controller 320 could not provide a recovery.

As described herein, the error signal is made deterministic by delay compensation. The determinism reduces the worst case scenario of timing for the error alert signal. In traditional systems, the transmission line for the error alert signal was routed the same direction as the C/A transmission line. Because of this, the error alert signals in traditional systems could come at any time between approximately twice the time the C/A signal takes to reach the first device, to approximately twice the time the C/A signal takes to reach the last device. There could be a different of more than a nanosecond in timing, which corresponds to many pipeline stages of instructions for a gigahertz speed processor. Worse than the difference in timing is the fact that there is no way in traditional systems to determine when the error alert signal is going to be received.

With the traditional worst-case scenario of timing, controller 320 had to keep history deep enough to service the worst-case error alert timing scenario. With the delay compensation described herein, history 322 can be made smaller due to improvement in the worst-case scenario. In one embodiment, the last device to receive the C/A signal is the closest connected to the memory controller on the error alert signal line. With such a configuration, the error alert signal will reach the host at approximately the same time no matter which memory device generates the signal. The alert signaling thus becomes deterministic. In one embodiment, the timing of the signaling is approximately 2 ns, which corresponds to approximately 15-20 pipeline stages in current systems. Even if different processors of somewhat different speeds are used, the relationship or the number of stages stays the same. Contrast such an approach to traditional systems that would require changing the pipelines, and potentially changing the depth of the history System 300 includes representative illustrations of "flight time" of signals, or the time for signals to propagate along the transmission lines to various destinations. It will be understood that system 300 is one block representation of the system, and so the representations of the propagation times are not to scale.

Assume that the flight time of a C/A signal along the C/A bus from controller 320 to DRAM0 is X ns. Assume also that the flight time for ALERT_n from DRAM15 to controller 320 is also X ns. The flight time of X ns from DRAM15 to controller 320 is merely a convenient approximation for purposes of this discussion. In reality the loading and bus characteristics of the error alert bus would cause the flight time to be a little longer than the flight time of the C/A signal to DRAM0, even assuming the physical length of the transmission lines was identical. Still, the approximation is close enough for purposes of discussion here, seeing that the difference in time is expected to be only a small percentage of X ns.

Assume next that the flight time between DRAM0 and DRAM15 is Y ns. Another approximation that will be made for purposes of discussion here is that the flight time for ALERT_n between DRAM0 and DRAM15 is also Y ns. Again, the reality is that ALERT_n will be slower than the C/A signal due to its signaling characteristics and loading, but it should be within a reasonable percentage. Using the above assumptions, it can be seen that if a command is generated by controller 320, it will be sampled by DRAM0 after a delay of X ns. If DRAM0 reports an error, the total latency from sending the command to receiving the error alert signal at controller 320 is X+Y+X ns [X ns flight time to DRAM0 plus Y ns flight time of the error alert signal from DRAM0 to DRAM15 plus X ns flight time of the error alert signal from DRAM15 to the host (controller 320)].

If instead of an error reported by DRAM0, DRAM15 reports an error, the latency from sending the command to receiving the error alert signal at controller 320 is again X+Y+X ns [X+Y ns flight time for the C/A signal to reach DRAM15 plus X ns flight time from DRAM15 to controller 320 for the error alert signal]. Thus, in both cases the latency at controller 320 for error indication is X+Y+X ns=2X+Y ns. Compare that result to the worst case scenario if the error alert signal line is routed the same direction as the C/A line. In that case the latency would be X+Y+Y+X ns [X+Y ns flight time for the C/A signal from controller 320 to DRAM15 plus Y+X ns flight time for the error alert signal from DRAM15 to controller 320]. Thus, there is a savings of Y ns latency from the worst case scenario.

Figure 4:
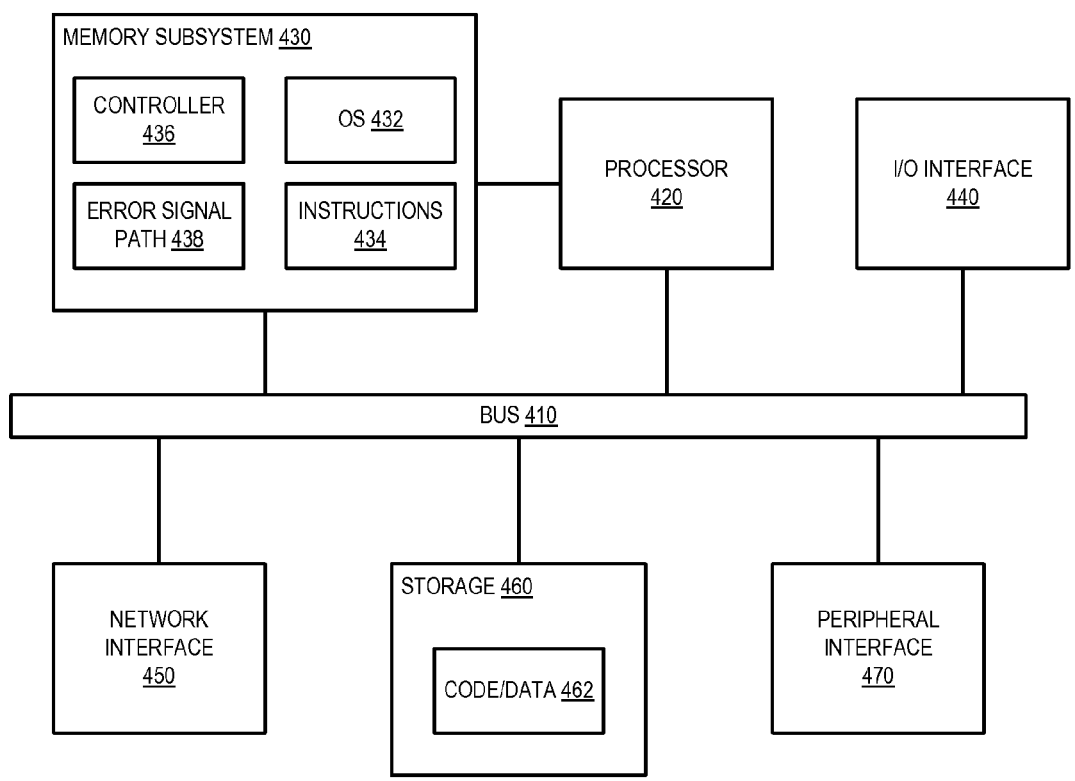
FIG. 4 is a block diagram of an embodiment of a computing system in which delay-compensated error signaling can be used.

FIG. 4 is a block diagram of an embodiment of a computing system in which delay-compensated error signaling can be used. System 400 represents a computing device in accordance with any embodiment described herein, and can be a laptop computer, a desktop computer, a server, a gaming or entertainment control system, a scanner, copier, printer, or other electronic device. System 400 includes processor 420, which provides processing, operation management, and execution of instructions for system 400. Processor 420 can include any type of microprocessor, central processing unit (CPU), processing core, or other processing hardware to provide processing for system 400. Processor 420 controls the overall operation of system 400, and can be include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 430 represents the main memory of system 400, and provides temporary storage for code to be executed by processor 420, or data values to be used in executing a routine. Memory subsystem 430 can include one or more memory devices such as read-only memory (ROM), flash memory, one or more varieties of random access memory (RAM), or other memory devices, or a combination of such devices. Memory subsystem 430 stores and hosts, among other things, operating system (OS) 432 to provide a software platform for execution of instructions in system 400. Additionally, other instructions 434 are stored and executed from memory subsystem 430 to provide the logic and the processing of system 400. OS 432 and instructions 434 are executed by processor 420.

Memory subsystem 430 includes controller 436, which is a memory controller that manages the memory devices that make up the physical storage of the main memory. Controller 436 sends a C/A signal over a C/A signal line as described above. In one embodiment, memory subsystem 430 includes error signal path 438, which is a delay-compensated error signaling line. When memory devices of the subsystem detect an error, they send an error alert signal over path 438, which provides deterministic timing for controller 436 to receive the alert signal.

Processor 420 and memory subsystem 430 are coupled to bus/bus system 410. Bus 410 is an abstraction that represents any one or more separate physical buses, communication lines/interfaces, and/or point-to-point connections, connected by appropriate bridges, adapters, and/or controllers. Therefore, bus 410 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 410 can also correspond to interfaces in network interface 450.

System 400 also includes one or more input/output (I/O) interface(s) 440, network interface 450, one or more internal mass storage device(s) 460, and peripheral interface 470 coupled to bus 410. I/O interface 440 can include one or more interface components through which a user interacts with system 400 (e.g., video, audio, and/or alphanumeric interfacing). Network interface 450 provides system 400 the ability to communicate with remote devices (e.g., servers, other computing devices) over one or more networks. Network interface 450 can include an Ethernet adapter, wireless interconnection components, USB (universal serial bus), or other wired or wireless standards-based or proprietary interfaces.

Storage 460 can be or include any conventional medium for storing large amounts of data in a nonvolatile manner, such as one or more magnetic, solid state, or optical based disks, or a combination. Storage 460 hold code or instructions and data 462 in a persistent state (i.e., the value is retained despite interruption of power to system 400). Storage 460 can be generically considered to be a "memory," although memory 430 is the executing or operating memory to provide instructions to processor 420. Whereas storage 460 is nonvolatile, memory 430 can include volatile memory (i.e., the value or state of the data is indeterminate if power is interrupted to system 400).

Peripheral interface 470 can include any hardware interface not specifically mentioned above. Peripherals refer generally to devices that connect dependently to system 400. A dependent connection is one where system 400 provides the software and/or hardware platform on which operation executes, and with which a user interacts.

Figure 5:
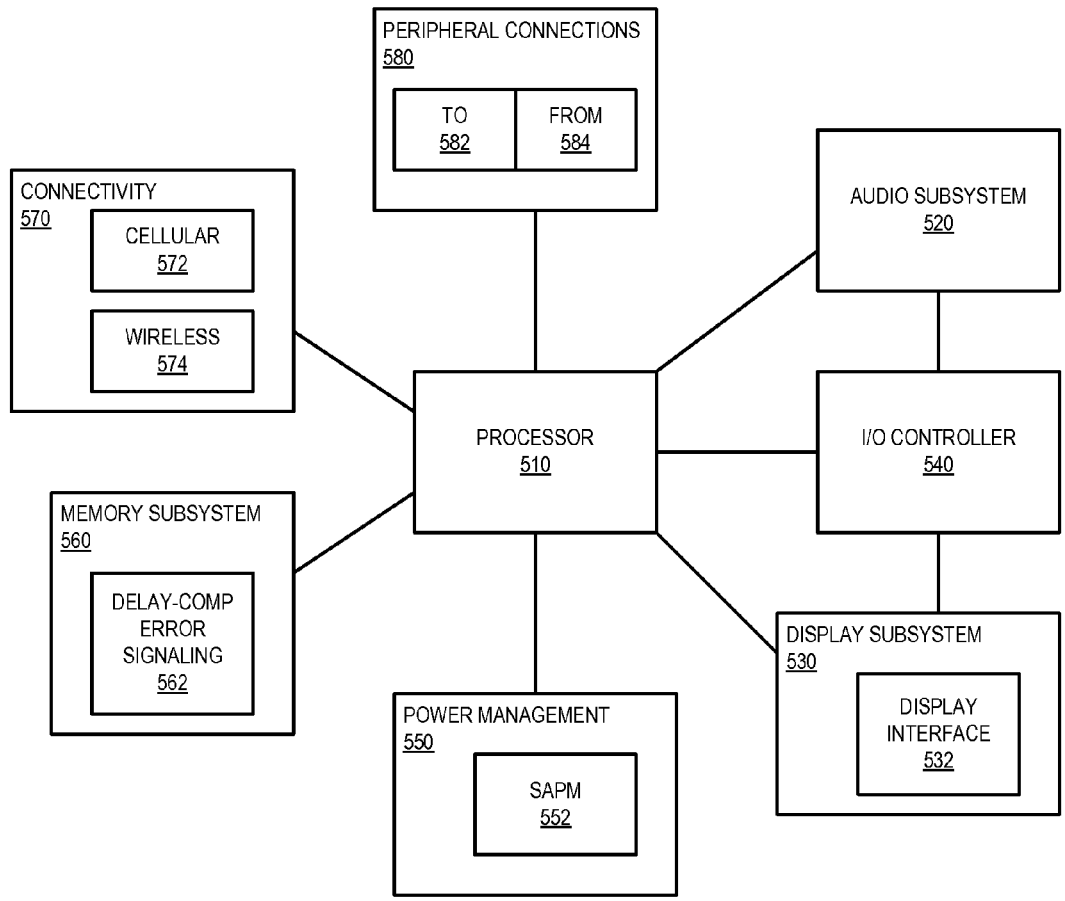
FIG. 5 is a block diagram of an embodiment of a mobile device in which delay-compensated error signaling can be used.

FIG. 5 is a block diagram of an embodiment of a mobile device in which delay-compensated error signaling can be used. Device 500 represents a mobile computing device, such as a computing tablet, a mobile phone or smartphone, a wireless-enabled e-reader, or other mobile device. It will be understood that certain of the components are shown generally, and not all components of such a device are shown in device 500.

Device 500 includes processor 510, which performs the primary processing operations of device 500. Processor 510 can include one or more physical devices, such as microprocessors, application processors, microcontrollers, programmable logic devices, or other processing means. In one embodiment, processor 510 includes optical interface components in addition to a processor die. Thus, the processor die and photonic components are in the same package. Such a processor package can interface optically with an optical connector in accordance with any embodiment described herein.

The processing operations performed by processor 510 include the execution of an operating platform or operating system on which applications and/or device functions are executed. The processing operations include operations related to I/O (input/output) with a human user or with other devices, operations related to power management, and/or operations related to connecting device 500 to another device. The processing operations can also include operations related to audio I/O and/or display I/O.

In one embodiment, device 500 includes audio subsystem 520, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 500, or connected to device 500. In one embodiment, a user interacts with device 500 by providing audio commands that are received and processed by processor 510.

Display subsystem 530 represents hardware (e.g., display devices) and software (e.g., drivers) components that provide a visual and/or tactile display for a user to interact with the computing device. Display subsystem 530 includes display interface 532, which includes the particular screen or hardware device used to provide a display to a user. In one embodiment, display interface 532 includes logic separate from processor 510 to perform at least some processing related to the display. In one embodiment, display subsystem 530 includes a touchscreen device that provides both output and input to a user.

I/O controller 540 represents hardware devices and software components related to interaction with a user. I/O controller 540 can operate to manage hardware that is part of audio subsystem 520 and/or display subsystem 530. Additionally, I/O controller 540 illustrates a connection point for additional devices that connect to device 500 through which a user might interact with the system. For example, devices that can be attached to device 500 might include microphone devices, speaker or stereo systems, video systems or other display device, keyboard or keypad devices, or other I/O devices for use with specific applications such as card readers or other devices.

As mentioned above, I/O controller 540 can interact with audio subsystem 520 and/or display subsystem 530. For example, input through a microphone or other audio device can provide input or commands for one or more applications or functions of device 500. Additionally, audio output can be provided instead of or in addition to display output. In another example, if display subsystem includes a touchscreen, the display device also acts as an input device, which can be at least partially managed by I/O controller 540. There can also be additional buttons or switches on device 500 to provide I/O functions managed by I/O controller 540.

In one embodiment, I/O controller 540 manages devices such as accelerometers, cameras, light sensors or other environmental sensors, gyroscopes, global positioning system (GPS), or other hardware that can be included in device 500. The input can be part of direct user interaction, as well as providing environmental input to the system to influence its operations (such as filtering for noise, adjusting displays for brightness detection, applying a flash for a camera, or other features).

In one embodiment, device 500 includes power management 550 that manages battery power usage, charging of the battery, and features related to power saving operation. Memory subsystem 560 includes memory devices for storing information in device 500. Memory can include nonvolatile (state does not change if power to the memory device is interrupted) and/or volatile (state is indeterminate if power to the memory device is interrupted) memory devices. Memory 560 can store application data, user data, music, photos, documents, or other data, as well as system data (whether long-term or temporary) related to the execution of the applications and functions of system 500.

In one embodiment, memory subsystem 560 includes delay-compensated error alert signaling 572. The alert signaling can be performed in accordance with any embodiment described herein. The delay compensation can be provided by physically routing the error alert transmission line in the opposite direction from the C/A transmission line.

Connectivity 570 includes hardware devices (e.g., wireless and/or wired connectors and communication hardware) and software components (e.g., drivers, protocol stacks) to enable device 500 to communicate with external devices. The device could be separate devices, such as other computing devices, wireless access points or base stations, as well as peripherals such as headsets, printers, or other devices.

Connectivity 570 can include multiple different types of connectivity. To generalize, device 500 is illustrated with cellular connectivity 572 and wireless connectivity 574. Cellular connectivity 772 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 574 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 580 include hardware interfaces and connectors, as well as software components (e.g., drivers, protocol stacks) to make peripheral connections. It will be understood that device 500 could both be a peripheral device ("to" 582) to other computing devices, as well as have peripheral devices ("from" 584) connected to it. Device 500 commonly has a "docking" connector to connect to other computing devices for purposes such as managing (e.g., downloading and/or uploading, changing, synchronizing) content on device 500. Additionally, a docking connector can allow device 500 to connect to certain peripherals that allow device 500 to control content output, for example, to audiovisual or other systems.

In addition to a proprietary docking connector or other proprietary connection hardware, device 500 can make peripheral connections 580 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory module comprising:
   multiple dynamic random access memory (DRAM) devices to store data;

an address and command (ADD/CMD) signal line coupled to the DRAM devices and capable to couple to a memory controller, wherein the ADD/CMD signal line is capable to be driven with a command signal from the memory controller when coupled; and an error alert signal line coupled to the DRAM devices and capable to couple to the memory controller, one or more of the DRAM devices capable to drive an error alert signal on the error alert signal line in response to an error detection, wherein a DRAM device to be closest to the memory controller along a physical routing of the ADD/CMD signal line is to be farthest from the memory controller along a physical routing of the error alert signal line, and a DRAM device to be farthest from the memory controller along the physical routing of the ADD/CMD signal line is to be closest to the memory controller along the physical routing of the error alert signal line.

2. The memory module of claim 1, wherein one or more of the DRAM devices capable to drive the error alert signal line in response to detection of a parity error in a command/address signal.

3. The memory module of claim 1, wherein the ADD/CMD signal line to be physically routed from a DRAM device of lowest address to a DRAM device of highest address, and the error alert signal line to be physically routed from the DRAM device of highest address to the DRAM device of the lowest address.

4. The memory module of claim 1, wherein the DRAM devices comprise DRAM devices of a SO-DIMM.

5. The memory module of claim 1, wherein the DRAM devices comprise DRAM devices of a UDIMM.

6. The memory module of claim 1, wherein one or more of the DRAM devices capable to drive the error alert signal line in response to detection of a cyclic redundancy check (CRC) error in the C/A signal.

7. The memory module of claim 1, wherein the ADD/CMD signal line comprises a signal line of a fly-by-topology command/address (C/A) bus to couple to the DRAMs one at a time in sequence.

8. The memory module of claim 1, wherein the ADD/CMD signal line comprises a trace on a dual inline memory module (DIMM) to carry the command signal to the DRAM devices.

9. A memory subsystem comprising:
a memory controller including
logic to drive a command/address (C/A) signal on an address and command (ADD/CMD) signal line; and
logic to receive an error alert signal over an error alert signal line in response to an error detection for the C/A signal; and
a dual in-line memory module (DIMM) coupled with the memory controller, the DIMM including
multiple synchronous dynamic random access memory (SDRAM) devices coupled to the ADD/CMD signal line and the error alert signal line;
wherein an SDRAM device to be closest to the memory controller along a physical routing of the ADD/CMD signal line is to be farthest away from the memory controller along a physical routing of the error alert signal line, and an SDRAM device to be farthest from the memory controller along the physical routing of the ADD/CMD signal line is to be closest to the memory controller along the physical routing of the error alert signal line.

10. The memory subsystem of claim 9, wherein one or more of the SDRAM devices capable to drive the error alert signal line in response to detection of a parity error in the C/A signal.

11. The memory subsystem of claim 9, wherein the ADD/CMD signal line to be physically routed from a SDRAM device of lowest address to a SDRAM device of highest address, and the error alert signal line to be physically routed from the SDRAM device of highest address to the SDRAM device of the lowest address.

12. The memory subsystem of claim 9, wherein the memory controller capable to store a recovery history comprising a number of entries based on a worst case timing of the error alert signal.

13. The memory subsystem of claim 9, wherein the DIMM comprises a SO-DIMM.

14. The memory subsystem of claim 9, wherein the DIMM comprises a UDIMM.

15. The memory subsystem of claim 9, wherein one or more of the SDRAM devices capable to drive the error alert signal line in response to detection of a cyclic redundancy check (CRC) error in the C/A signal.

16. The memory subsystem of claim 9, wherein the ADD/CMD signal line comprises a signal line of a fly-by-topology C/A bus to couple to the SDRAMs one at a time in sequence.

17. The memory subsystem of claim 9, wherein the ADD/CMD signal line comprises a trace on a dual inline memory module (DIMM) to carry the C/A signal to the SDRAM devices.

18. An electronic device comprising:
a memory subsystem having comprising
a memory controller including logic to drive a command/address (C/A) signal on an address and command (ADD/CMD) signal line, and logic to receive an error alert signal over an error alert signal line in response to an error detection for the C/A signal, and
a dual in-line memory module (DIMM) coupled with the memory controller, the DIMM including multiple synchronous dynamic random access memory (SDRAM) devices coupled to the ADD/CMD signal line and the error alert signal line,
wherein an SDRAM device to be closest to the memory controller along a physical routing of the ADD/CMD signal line is to be farthest away from the memory controller along a physical routing of the error alert signal line, and an SDRAM device to be farthest from the memory controller along the physical routing of the ADD/CMD signal line is to be closest to the memory controller along the physical routing of the error alert signal line; and
a multicore processor coupled to the memory subsystem to access the memory subsystem during execution of the processor.

19. The device of claim 18, wherein one or more of the SDRAM devices capable to drive the error alert signal line in response to detection of a parity error in the C/A signal.

20. The device of claim 18, wherein the SDRAM devices capable to drive the error alert signal line in response to detection of a cyclic redundancy check (CRC) error in the C/A signal.

21. The device of claim 18, wherein the ADD/CMD signal line to be physically routed from a SDRAM device of lowest address to a SDRAM device of highest address, and the error alert signal line to be physically routed from the SDRAM device of highest address to the SDRAM device of the lowest address.

22. The device of claim 18, wherein the memory controller capable to store a recovery history comprising a number of entries based on a worst case timing of the error alert signal.

23. The device of claim 18, wherein the DIMM comprises a first DIMM, and wherein the memory subsystem further comprises a second DIMM coupled with the memory controller, the second DIMM including multiple SDRAM devices coupled to the ADD/CMD signal line and the error alert signal line, wherein the C/A signal to be physically routed on the ADD/CMD signal line in a first direction, and the error alert signal to be physically routed on the error alert signal line in a second direction opposite to the first direction at the second DIMM.

24. The device of claim 18, wherein the DIMM comprises a SO-DIMM.

25. The device of claim 18, wherein the DIMM comprises a UDIMM.

26. The device of claim 18, wherein the ADD/CMD signal line comprises a signal line of a fly-by-topology C/A bus to couple to the SDRAMs one at a time in sequence.

27. The device of claim 18, wherein the ADD/CMD signal line comprises a trace on the DIMM to carry the C/A signal to the SDRAM devices.

* * * * *